United States Patent [19]

Shepherd et al.

[11] Patent Number: 5,331,293
[45] Date of Patent: Jul. 19, 1994

[54] COMPENSATED DIGITAL FREQUENCY SYNTHESIZER

[75] Inventors: Wayne P. Shepherd; Joseph P. Heck, both of Ft. Lauderdale, Fla.

[73] Assignee: Motorola, Inc., Schaumburg, Ill.

[21] Appl. No.: 940,259

[22] Filed: Sep. 2, 1992

[51] Int. Cl.$^5$ .......................... H03L 7/00; H04B 1/40
[52] U.S. Cl. ...................................... 331/1 R; 331/16;
331/177 R; 331/179; 332/123; 375/118;
455/76; 455/119; 455/258
[58] Field of Search ............... 332/107, 123, 159, 162;
331/16, 179, 23.1 R, 177 R; 329/318, 319, 349,
353; 375/118, 44; 455/76, 113, 119, 126, 258

[56] References Cited

U.S. PATENT DOCUMENTS

| | | | |
|---|---|---|---|
| 4,816,774 | 3/1989 | Martin | 331/1 A |
| 4,901,265 | 2/1990 | Kerr et al. | 364/721 |
| 4,905,177 | 2/1990 | Weaver, Jr. et al. | 364/721 |
| 5,021,754 | 6/1991 | Shepherd et al. | 332/128 |
| 5,111,162 | 5/1992 | Hietala et al. | 332/127 |
| 5,130,671 | 7/1992 | Shahriary et al. | 331/16 |
| 5,162,763 | 11/1992 | Morris | 332/170 |
| 5,184,092 | 2/1993 | Shahriary et al. | 331/16 |

OTHER PUBLICATIONS

"Communication Circuits: Analysis and Design" by Kenneth K. Clarke and Donald T. Hess, Sep. 198, pp. 615-618. Addison-Wesley.

"Q2334 Dual Direct Digital Synthesizer Technical Data Sheet" Jun. 1991, pp. 1-35 by Qualcomm, Inc. (no author).

*Primary Examiner*—David Mis
*Attorney, Agent, or Firm*—Pedro P. Hernandez

[57] ABSTRACT

A digital frequency synthesizer circuit with spur compensation includes a demodulator circuit (118) for demodulating the output signal (116) of the synthesizer's accumulator (108). Demodulator (118) also inverts the signal, and provides an inverted demodulated output signal (142) which is then coupled to the synthesizer clock (124) after passing through a gain stage (122) in order to modulate the synthesizer clock (124) with a compensation signal (146). The compensated clock signal (140) is then sent to accumulator (108) in order to substantially cancel out any jitter in the accumulator's output signal (116). The modulation signal (MOD IN) which is digitally applied to accumulator (108) is applied in analog fashion to the gain stage (122) in order to prevent the desired modulation signal (MOD IN) from being canceled in the output signal (116).

10 Claims, 3 Drawing Sheets

COMPENSATED DIGITAL FREQUENCY SYNTHESIZER

TECHNICAL FIELD

This invention relates generally to the field of frequency synthesis and more specifically to a low spurious output digital synthesizer.

BACKGROUND

Conventional direct digital synthesizers (DDS) usually comprise at least a high speed clock, a programmable shift register and an N-bit accumulator which includes a carry out output. The carry out output signal from the synthesizer has an average frequency (Fo) equal to the clock frequency (Fc) divided by the accumulator length ($2^n$) times the phase increment value (program value, P). The relationship can be stated mathematically as:

$$F_o = (F_c/2^n) * P$$

where $F_c/2^n$ defines the resolution of the frequency output. For example, if we assume a clock frequency of 1 gigahertz and a accumulator having 32 bits the resolution can be calculated as:

$$1 \text{ GHZ}/2^{32} = 0.2328 \text{ Hz}.$$

A spectral analysis of a conventional DDS output signal would show that the output frequency Fo and its harmonics include sideband spurs (spurious emissions). These sideband spurs (or jitter) when viewed from a spectrum analyzer exhibit a pattern which resemble a Christmas-tree around each output frequency and their respective harmonics, at an offset frequency equal to the resolution of the accumulator, and also at harmonics of the offset frequencies. The sideband spur levels will vary according to the jitter pattern generated by the relationship of the value of "P" to the value of "$2^n$" in the previously mentioned formula. These spurs typically make conventional DDS output signals unstable as low noise RF signal sources.

In DDS applications, where a sine wave or other periodic wave is generated, the amplitude quantization errors become highly correlated to the wave being generated, thus causing spurs to be generated along with the output signal. A need thus exists for a method and apparatus for minimizing the jitter in a direct digital synthesizer in order to provide for very low spurious output signals. This would in effect allow for a direct digital synthesizer to be used as a low spurious signal source for use in communication devices.

DETAILED DESCRIPTION OF THE PREFERRED EMBODIMENT

Figure 1:
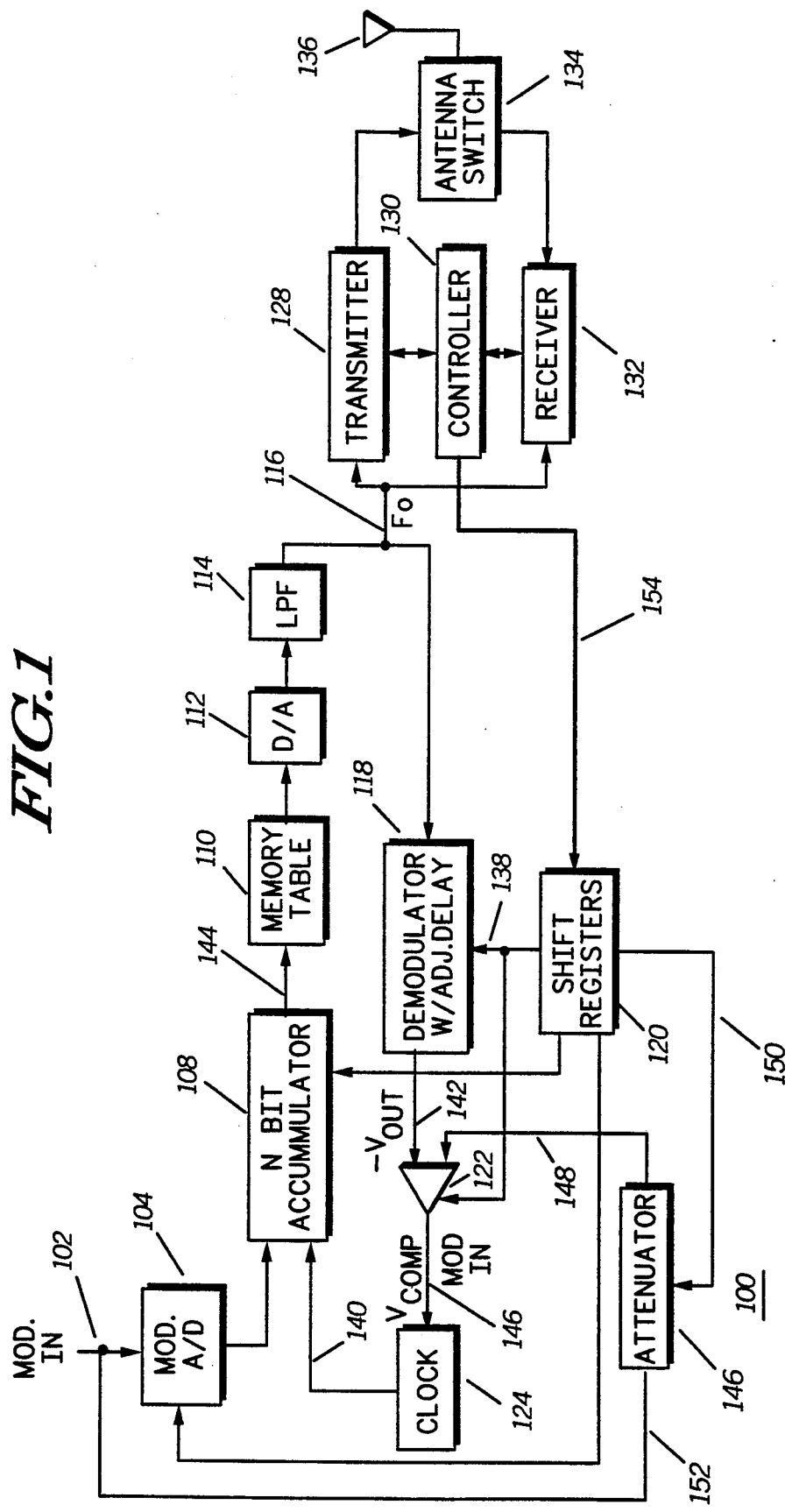
FIG. 1 is a block diagram of a communication device having a direct digital synthesizer in accordance with the present invention.

Referring now to the drawings and specifically to FIG. 1, there is shown a block diagram of a communication device such as a radio 100. Radio 100 utilizes a direct digital synthesizer (DDS) section in accordance with the present invention. The digital synthesizer section includes an input means such as input terminal 102 for receiving a desired modulation signal. The modulation signal is then sent through an analog to digital (A/D) converter 104 where the analog modulation signal is converted into a digital bit stream. The digital bit stream is then sent to an accumulator 108 having an "N" bit long register in order to modulate the accumulator. For example, accumulator 108 could be a 32 bit long accumulator.

Accumulator 108 or phase accumulator as it is also known, computes and stores the sum of the previously computed phase value coming from shift registers 120 to the phase increment value stored in accumulator 108 once during every clock cycle. An analog-to-digital converter (A/D) 104 is coupled to accumulator 108. A/D converter 104 includes an input terminal for receiving an external analog modulation signal 102 which A/D converter 104 converts into digital form and provides to accumulator 108. The digital information provided by shift register 120 and A/D converter 104 are then processed by accumulator 108 to yield the accumulator output signal 144.

Output 144 of accumulator 108 which is the instantaneous phase value, is in turn converted into sine amplitude (could also be converted into cosine or triangular wave forms depending on the application) by memory table (ROM look-up table) 110. The memory table output is then reconverted into an analog signal by digital to analog converter (D/A) 112.

The analog output signal provided by D/A converter 112, not only contains the desired sine wave as its major component, but also includes the higher frequency image components due to the conversion of a sampled wave form. In order to reduce the image signals to a desirable level, a low pass filter 114 is included. Both the memory table 110 and the D/A converter 112 are also clocked by a reference clock means such as clock 124.

Clock 124 is preferably a synthesized clock which includes a phase-lock-loop (PLL) circuit. The PLL circuit in clock 124 preferably includes a reference oscillator, the output of the reference oscillator being applied to a reference divider which is then coupled to a phase detector that has its output coupled, via a low pass filter, to a voltage controlled oscillator (VCO). The output of the VCO is coupled to the output of the synthesized clock and to a programmable divide by N divider (all of which are not shown). The output of the VCO providing the output signal for clock 124.

Present day compensation methods use the most-significant-bits (MSB) of accumulator 108 which will be denoted as "J", as the address of the ROM memory table 110 in order to generate a sine (cosine, triangular or other types of wave forms could also be generated) wave form in the D/A converter 112. For example, "J" may be equal to the 16 most-significant-bits of a 32 bit long accumulator. While the resolution spurs ($F_c/2^n$) are eliminated by this process, other spurs occur that are due to quantization errors in both the ROM memory table 110 and DAC 112. The quantization errors occur during the process of converting digital information such as sine amplitude into analog form. In digital synthesizers, these errors generated during the conversion process in turn generate unwanted spurious and harmonic noise on a periodic basis. These spurs are primarily amplitude modulation (AM) noise except when the spurs occur at zero-crossings.

The present invention's spur compensation method consists of first demodulating the DDS output signal (Fo) using demodulator 118. The demodulated signal is substantially inverted and the inverted output signal (−Vout) 142 is then amplified forming a compensation signal (Vcomp) 146 which is used to modulate synthesized clock 124. The modulated clock signal 140 is then fed back into accumulator 108 which helps cancel out the jitter (unwanted modulation caused by the operation of the digital synthesizer section) in the accumulator's carry out edges. A demodulator means such as demodulator 118, comprises a demodulator with adjustable delay 118, optional shift registers 120 and amplifier 122, as shown in FIG. 1. Demodulator 118 will be discussed in more detail later in this discussion. In order not to compensate the desired analog modulation signal (MOD IN), the desired modulation signal is added (summed) to the −$V_{OUT}$ signal 142 prior to being applied to clock 124.

The DDS output signal (Fo) 116 is coupled to conventional radio frequency transmitter 128 and receiver 132 sections as known in the art. A controller means such as controller 130 which can be a conventional microprocessor or microcontroller having associated control software controls the operation of both receiver 132 and transmitter 128. Controller 130 can have on board memory sections such as RAM, ROM and EEPROM. Transmitter 128 and receiver 132 sections are selectively coupled to antenna 136 via antenna switch 134. Controller 130 provides the program values to accumulator 108 and also controls demodulator 138 and A/D 104.

The amplitude of the demodulated compensation signal Vcomp signal 146 is adjusted with respect to the sideband spurs until spur cancellation occurs by adjusting the gain applied to amplifier 122. The modulation signal that is applied to input terminal 102 is also applied to gain stage 122 in order to prevent compensation of the desired modulation signal. The modulation signal which can be an analog message, is applied via line 152 to a programmable attenuator circuit 146. The programmable attenuator is under the control of controller 130 via line 150. The output signal 148 of attenuator 146 is then applied to gain stage 122 in order to sum the output signal 148 with the −$V_{OUT}$ signal 142.

The summing of both signals together by the gain stage 122 (which can be a programmable op-amp or other similar device) prevents compensation (cancellation) of the desired modulation signal (MOD IN applied to input terminal 102), when the V comp signal is generated. Programmable attenuator 146 provides for improved spur compensation capabilities given that the compensation circuit adjusts the amplitude of the desired modulation signal (under the control of controller 130) which is applied to clock 124 ($V_{COMP}$) in order to achieve compensation balance while preventing the compensation of the desired modulation signal (MOD IN signal applied to terminal 102).

Controller 130 provides adjustment values via bus 154 to shift registers 120 which are in turn sent to amplifier 122 for use in adjusting the deviation level of Vcomp signal 146. The modulated clock signal 140 is then fed back into accumulator 108 in order to provide spur cancellation. Once the initial adjustment is made, adjustment versus output frequency will be controlled by the program value "P" (sent from controller 130 to shift registers 120 to accumulator 108) and spur cancellation will be maintained. Typically, controller 130 will have stored program values in its associated memory section which would be associated with different output signal frequencies (Fo) 116. These values can be generated and stored in radio 100 during the radio manufacturing process. For example, controller 130 would know the exact values to send amplifer stage 122 and demodulator 118 in order to acheive optimum spur cancellation for a specific F0 signal 116 frequency.

Figure 2:
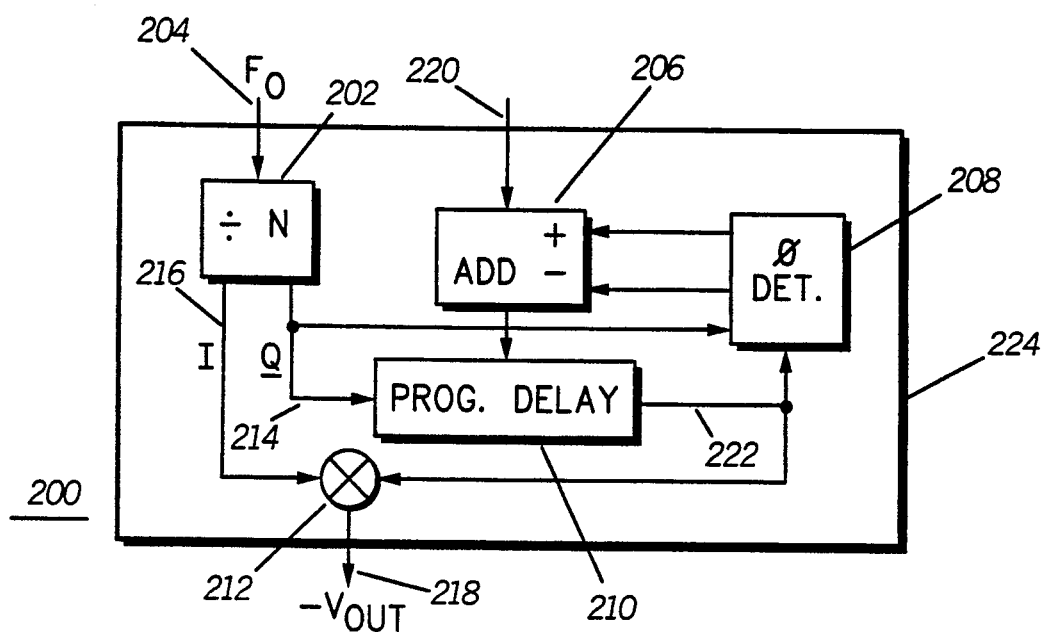
FIG. 2 is a block diagram of a demodulator as used in FIG. 1 in accordance with the present invention.

In FIG. 2, a frequency demodulator 200 similar to demodulator 118 of FIG. 1, is shown in more detail. Demodulator 200 includes an input terminal 204 for receiving the DDS signal (Fo) 116. The DDS signal is then sent to a phase-shifting circuit 202 which produces first and second signals such as an in-phase wave form (I) 216 and a quadrature wave form (Q) 214. The (I) and (Q) signals are approximately 90 degrees out of phase with respect to each other. Phase-shifting circuit 202 can be designed as a divide-by-four circuit in order to yield the 90 degree out of phase signals or by use of other well known phase-shifting circuit designs.

The quadrature signal (Q) 214 is applied to a programmable delay circuit 210 and also directly to phase detector 208. While the (I) in-phase signal 216 is coupled to mixer means 212 directly. The design provides for a demodulator having a time delay path adjusted to be 90 degrees out of phase as compared to the non-delayed path. The in-phase signal 216 and the delayed quadrature signal 222 are then mixed together using mixer 212 in order to provide for the inverted demodulated output signal (−Vout) 218 (signal 142 in FIG. 1). Output signal (−Vout) 218 (having only FM product) will have a bandwidth determined by time delay circuit 210. The compensation of the jitter spurs occur within this bandwidth. The preferable bandwidth of −Vout 218 would be in the range of 100 Khz to 1 Mhz. The specific bandwidth designed for will depend on the specific communication application the circuit is to be used in.

The programmable delay 210 is adjusted via a control signal which is sent via input 220 (same as the signal 138 in FIG. 1). The programmable delay is also adjusted by the feedback provided by phase detector circuit 208. A good discussion of time-delay frequency demodulation can be found in a book entitled "Communication Circuits: Analysis and Design", by Kenneth K. Clarke and Donald T. Hess, Second printing, September 1978, published by Addison-Wesley Publishing Company, pages 615–618, and which is hereby incorporated by reference. More specifically, page 616 discusses a time-delay frequency demodulator and the output of the demodulator (see equation 12.5-27).

The control signal which is sent to input 220 comes from shift registers 120 in FIG. 1. Shift registers 120 provide for a compensation control signal (e.g., digital word) whose specific value is provided by controller 130. Phase detector 208 determines if the quadrature signal which has been delayed 222 and the quadrature signal (Q) 214 that has been fed directly to phase detector 208 are in phase. If the two signals are not in phase, an adjustment signal is sent to adder 206 for adjustment of the programmable delay circuit 210. The adjustment signal from phase detector 208 can either positively or negatively adjust adder 206. Adder 206 adds the adjustment signal provided by phase detector 208 with the compensation word sent via input 220 in order to keep the quadrature signal edges aligned by adjusting the amount of delay provided by delay circuit 210.

Figure 3:
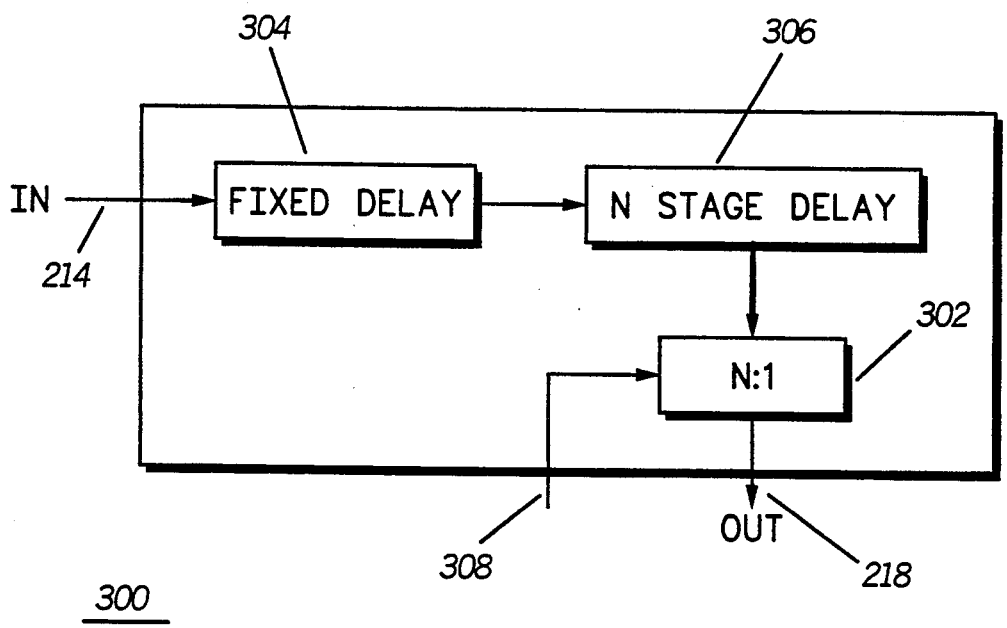
FIG. 3 is a block diagram of the program delay block in accordance with the present invention.

In FIG. 3, a block diagram of a programmable delay block 300, similar to the programmable delay block 210 of FIG. 2, is shown in more detail. Delay block 300 includes a fixed delay block 304 which in the preferred embodiment is designed to provide approximately 700 nanoseconds of delay. Delay block 300 also comprises a "N" stage programmable delay section 306 which in the preferred embodiment is a 64 stage delay section which is controlled by an external control signal. The amount of delay the programmable delay section 306 provides is selected by way of a 1 out of 64 multiplexer 302 which is controlled by the control signal coming in via input terminal 308. The control signal sent to input terminal 308 is the output signal of adder 206 shown in FIG. 2. Multiplexer 302 simply selects at what point of the 64 delay stages to tab the signal in order to provide the delayed output signal 218. The control signal presented at input 308 corresponds to the output signal of adder 206, shown in FIG. 2. This control signal can originate from controller 130 as shown in the preferred embodiment or from other circuitry found in radio 100.

In the preferred embodiment, each of the delay stages in the 64 stage delay section 306 provides approximately 40 nanosecond additional delay to the delay path. With multiplexer 302 choosing at what point along the 64 stage path to tap the delay section. The longer the delay provided by delay circuit 300 the more gain that is provided to the output signal −Vout 218. But, the longer the delay provided by circuit 300, the narrower the bandwidth of the demodulator. The design choice between the amount of gain provided and the amount of bandwidth provided by circuit 200 will depend on the specific application being designed. The amount of gain amplifier 122 will provide will be controlled by pre-stored values which are stored in controller 130.

Figure 4:
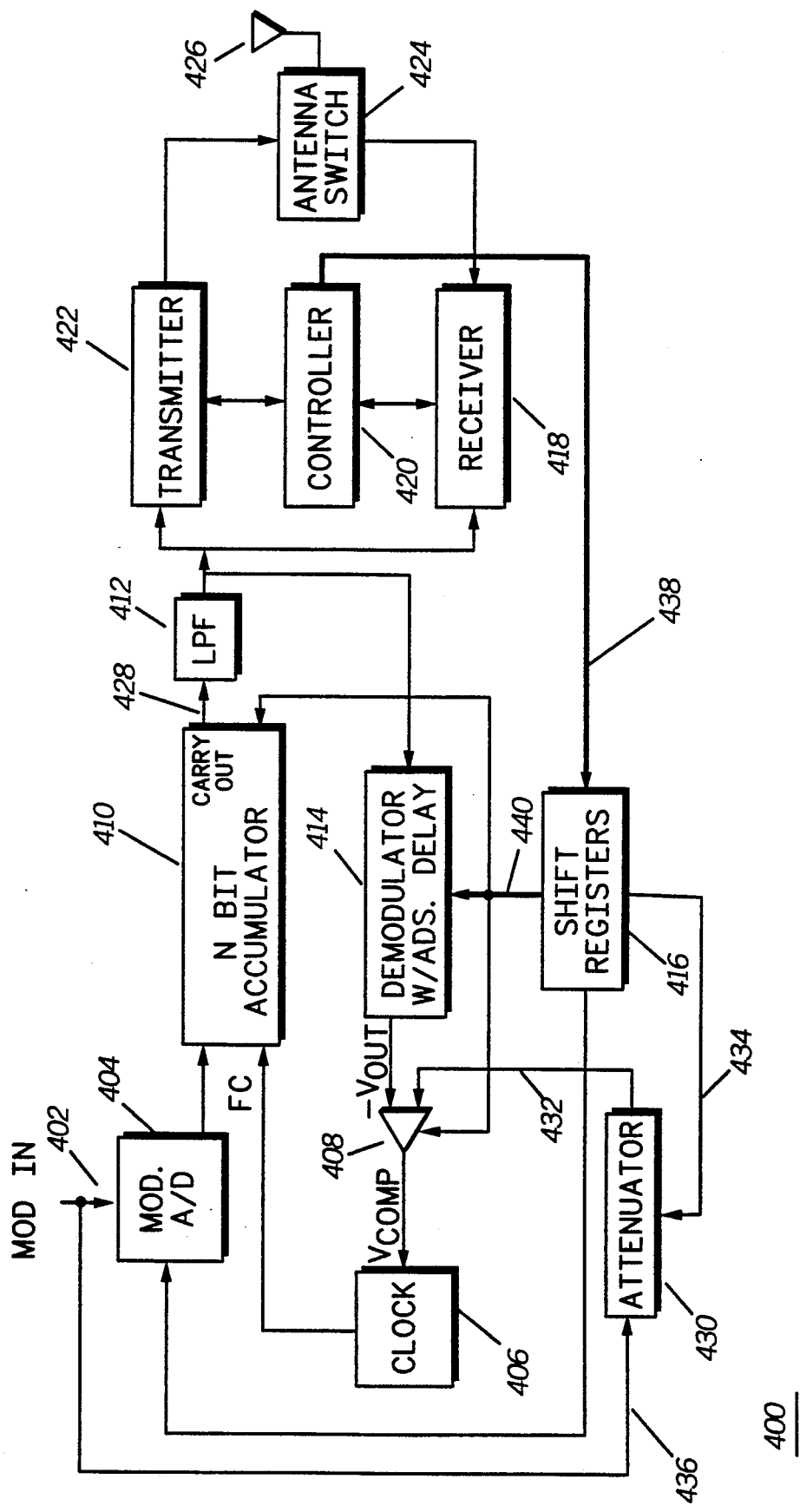
FIG. 4 is a second embodiment of a communication device in accordance with the present invention.

Referring to FIG. 4, a second embodiment of a communication device using the present invention is shown. The embodiment shown in FIG. 4, utilizes the carry out terminal of accumulator 410 instead of the phase accumulation terminal as used in FIG. 1. In this embodiment, the accumulator output signal 428 is provided to transmitter 422 and receiver 418 without the need of a look-up table or D/A converter after being filtered by low pass filter 412.

In a typical operational example, synthesized clock 406 could be a 1 gigahertz clock and the program values (P) sent to accumulator 410 would be such to cause a 450 MHz carrier signal to be generated as output signal 428. In this particular example, synthesizer 400 would be switching back and forth between a divide by 2 and a divide by 3 operation since sometimes it would take 3 clock cycles to generate a carrier signal, and sometimes it would take 2 clock cycles to generate a carrier signal. But over time, it would average out to an output signal 428 having a frequency of 450 MHz.

In this embodiment, the accumulator's carry out signal 428 is demodulated after it has been filtered by low pass filter 412 by demodulator 414. The inverted demodulated signal (−Vout) is then amplified by an amplifier means such as amplifier 408. The amount of amplification will depend as in the circuit of FIG. 1, on the amount of signal deviation required in order to compensate for the induced modulation (spurs). Amplifier 408, like amplifier 122 in FIG. 1, also receives the desired modulation signal (MOD IN) after being sent through attenuator 430 in order to prevent compensation of the desired modulation signal. Attenuator stage 430 receives the desired modulation signal via line 436 and the amount of attenuation provided by the attenuator 430 is under the control of controller 420 via line 434.

The amplified compensation signal (Vcomp) is then coupled back into clock 124 in order to modulate the clock signal in order to balance out any unwanted spurs. The goal of the compensation network is to reduce all of the unwanted spurs while having no effect on the desired modulation (MOD IN). The modulation of the clock 406 by the compensation circuit reduces the carry out jitter associated with quantization errors in the digital synthesizer since the modulated clock signal (Fc, compensation clock signal) is fed back into accumulator 410.

In FIG. 4, modulation will preferably be two-spot, with the program value "P" being modulated by the output signal of analog-to-digital converter (A/D) 404 and the modulation signal (in this case, prior to being converted into digital form) is added to the inverse demodulated signal (−Vout) as signal 432. This prevents the desired modulation signal (MOD IN) from being canceled while still allowing for the unwanted spurious response from the output of the LPF 412 from being greatly reduced. Communication device 400 as shown includes an A/D converter 404 having an input terminal for receiving a modulation input signal 402. The digitized signal is then sent to 32 bit accumulator 410. Carry out signal 428 of accumulator 410 is filtered by low pass filter 412 with the filtered signal being sent to transmitter 422 and receiver 418. The signal is also coupled back to the compensation circuit comprising demodulator 414 in order to minimize the output signal jitter.

As discussed above, the inverted demodulated signal −Vout is sent to amplifier stage 408 were the −Vout signal is amplified. The amount of amplification provided by amplifier 408 is determined by the values sent by controller 420 (via shift registers 416). The amount of gain provided by amplifier 408 is adjusted by the signal sent by shift registers 416 until cancellation occurs (balance is maintained). The number of bits (resolution level) used for gain and delay adjustment, plus the total time delay from the accumulator 410 to the output of amplifier 408 will determine the degree of balance which the circuit can achieve. Compensation signal (Vcomp) is then coupled to clock 406 in order to modulate the clock signal and compensate for any accumulator carry out jitters as previously discussed.

The present invention provides for an improvement in modulation balance since only one modulation adjustment is needed, no "Ko" variation (open loop gain variation) versus frequency is required, as in other synthesizer compensation schemes such as that taught in U.S. Pat. No. 5,021,754, entitled "Fractional-N Synthesizer Having Modulation Spur Compensation", by Shepherd et al., and which is hereby incorporated by reference. The total amount of compensation achieved will be determined by the resolution of the adjustment attenuators. The lock time and the Hum and Noise specification of the circuit will be dominated by the loop bandwidth response of the demodulator. The transient response of the compensation network will also have a major effect on both the lock time performance as well as the communication device's Hum and Noise specifications.

In summary, the present invention provides for an improved spur compensated digital synthesizer by compensating for accumulator jitter. In one embodiment, the compensation scheme demodulates the accumulator carry out output signal and then inverts the "sense" of the modulation signal. The inverted signal is then used to modulate the reference clock signal (Fc) of the accumulator.

What is claimed is:

1. A frequency synthesizer providing an output signal having reduced spurious output, comprising:
   a time-delay frequency demodulator responsive to the output signal of the frequency synthesizer for providing a demodulator output signal which is substantially the inverse of the spurious output;
   a reference clock means modulated with the demodulator output signal for providing a modulated reference clock signal; and
   an accumulator having an input terminal for receiving the modulated reference clock signal and adjusting a value in the accumulator in response to the modulated reference clock signal so that the spurious output found in the frequency synthesizer's output signal is reduced.

2. A frequency synthesizer providing an output signal having reduced spurious output, comprising:
   an accumulator;
   a demodulator means responsive to the output signal of the frequency synthesizer for providing a demodulator output signal which is substantially the inverse of the spurious output;
   a reference clock means modulated with the demodulator output signal for providing a modulated reference clock signal;
   an amplifier having an input terminal coupled to the demodulator means for receiving the demodulator output signal and an output terminal coupled to the reference clock means, the amplifier providing for amplification of the demodulator output signal;
   an input port for receiving an external modulation signal;
   an analog-to-digital converter coupled to the input port for converting the external modulation signal into a digital signal, the external modulation signal is also received by the amplifier means for combining the external modulation signal with the demodulator output signal; and
   the accumulator includes a first accumulator input terminal for receiving the digital signal and storing the digital signal as a value in the accumulator, the accumulator including a second accumulator input terminal for receiving the modulated reference clock signal and adjusting the value in the accumulator in response to the modulated reference clock signal for reducing the spurious output found in the frequency synthesizer's output signal.

3. A frequency synthesizer as defined in claim 2, wherein the demodulator means comprises:
   an input terminal for receiving the synthesizer output signal;
   a phase shifting circuit responsive to the synthesizer output signal to provide respective versions of said synthesizer output signal as an inphase signal and a quadrature signal;
   a delay circuit coupled to the phase shifting circuit to receive the quadrature signal, the delay circuit having an output providing a delayed signal; and
   a mixer means for mixing the inphase signal and the delayed signal to provide the demodulator output signal.

4. A method for reducing spurious output in the output signal of a synthesizer, the synthesizer including a modulation controlled clock having a clock signal output and an accumulator coupled to the clock signal output and the accumulator is modulated with an analog modulation signal that has been changed to digital form, comprising the steps of:
   demodulating the output signal of the synthesizer to produce a demodulator output signal which is substantially the inverse of the spurious output;
   modulating the clock with the demodulator output signal in order for the clock to produce a modulated clock signal at the clock signal output;
   providing the modulated clock signal to the accumulator; and
   adjusting a value in the accumulator in response to the modulated clock signal to reduce the spurious output in the synthesizer output signal.

5. A method for reducing spurious output in the output signal of a digital synthesizer, the digital synthesizer including a modulation controlled clock having a clock signal output and an accumulator coupled to the clock signal output, the digital synthesizer including an input terminal for receiving a digital signal, the method comprising the steps of:
   demodulating the output signal of the digital synthesizer to produce a demodulator output signal which is substantially the inverse of the spurious output;
   modulating the clock with the demodulator output signal in order for the clock to produce a modulated clock signal;
   providing the digital signal to the accumulator so that a value in the accumulator is modified; and
   receiving the modulated clock signal at the accumulator so that the value in the accumulator is adjusted in response to the modulated clock signal to reduce the spurious output in the synthesizer output signal.

6. A radio, comprising:
   a receiver; and
   a frequency synthesizer providing an output signal having reduced spurious output to the receiver, the frequency synthesizer comprising:
      an accumulator including an output terminal for providing an output signal;
      a time-delay frequency demodulator responsive to the output signal of the synthesizer for demodulating the output signal and providing a demodulator output signal that is substantially the inverse of the spurious output; and
      a reference clock means modulated with the demodulator output signal for providing a modulated reference clock signal, the accumulator in response to the modulated reference clock signal adjusts a value in the accumulator so that the spurious output is reduced; and
   wherein the demodulator means is a time-delay frequency.

7. A radio as defined in claim 6, further comprising:
   an amplifier means having an input terminal coupled to the demodulator means and an output terminal coupled to the reference clock means, the amplifier means providing for amplification of the demodulator output signal.

8. A radio as defined in claim 7, further comprising:
a control means coupled to the amplifier means for controlling the amount of amplification provided to the demodulator output signal.

9. A radio as defined in claim 7, further comprising:
an input terminal for receiving a modulation signal, and
the modulation signal is received by the amplifier means so that the modulation signal is combined with the demodulator output signal.

10. A radio, comprising:
a receiver; and
a frequency synthesizer providing an output signal having spurious output to the receiver, the frequency synthesizer comprising:
   an accumulator including an output terminal for providing an output signal;
   a time-delay frequency demodulator responsive to the output signal of the synthesizer for demodulating the output signal and providing a demodulator output signal that is substantially the inverse of the spurious output;
   a reference clock means modulated with the demodulator output signal for providing a modulated reference clock signal, the accumulator in response to the modulated reference clock signal adjusts a value in the accumulator so that the spurious output is reduced; and
the demodulator means comprises:
   an input terminal for receiving the synthesizer output signal;
   a phase shifting circuit responsive to the synthesizer output signal to provide respective versions of said synthesizer output signal as an inphase signal and a quadrature signal;
   a delay circuit coupled to the phase shifting circuit to receive the quadrature signal, the delay circuit having an output providing a delayed signal; and
   a mixer means for mixing the inphase signal and the delayed signal to provide the demodulator output signal.

* * * * *